US005652798A

United States Patent [19]

Mizushima

[11] Patent Number: 5,652,798

[45] Date of Patent: Jul. 29, 1997

[54] REVERBERANT CHARACTERISTIC SIGNAL GENERATION APPARATUS

[75] Inventor: Koichiro Mizushima, Yokohama, Japan

[73] Assignee: Matsushita Electric Industrial Co., Ltd., Japan

[21] Appl. No.: 476,906

[22] Filed: Jun. 7, 1995

[30] Foreign Application Priority Data

Jun. 8, 1994 [JP] Japan .................................... 6-126473

[51] Int. Cl.$^6$ ........................................................ H03G 3/00

[52] U.S. Cl. ................................ 381/63; 381/61; 381/17; 84/630; 84/DIG. 26

[58] Field of Search .................................. 381/63, 62, 60, 381/25, 74, 17, 61; 84/630, 707, DIG. 26

[56] References Cited

U.S. PATENT DOCUMENTS

| | | | |
|---|---|---|---|
| 5,025,472 | 6/1991 | Shimizu et al. | 381/63 |
| 5,467,401 | 11/1995 | Nagamitsu et al. | 381/63 |
| 5,559,891 | 9/1996 | Kuusama et al. | 381/63 |

FOREIGN PATENT DOCUMENTS

| | | |
|---|---|---|
| 0465662 | 1/1992 | European Pat. Off. . |
| 1-308987 | 12/1989 | Japan . |
| 2-272807 | 11/1990 | Japan . |
| 932384 | 11/1993 | WIPO . |

*Primary Examiner*—Minsun Oh
*Attorney, Agent, or Firm*—Rossi & Associates

[57] ABSTRACT

This reverberant characteristic signal generation apparatus comprises a measuring room where a speaker and one channel of microphone is provided to supply one channel of a pulse train indicative of the reverberant characteristic of the room, a direction data generation portion for generating direction data indicative of an imaginary incoming direction of a indirectly transmitted impulse sound, an operation portion for operating the time differences due to the inclination of the incoming direction of the indirectly transmitted impulse sound to an imaginary dummy head, having right and left ears having a distance therebetween, at the position of the microphone, and an output portion for outputting an amplitude of each pulse and the delay time of the indirectly transmitted impulse sound to the microphone and the time differences to provide the reverberant characteristic signal which may be recorded by a recorder. The pulse train may be generated by a simulation of the indirectly transmitted impulse sound wherein the parameters of the size of the room, locations of the speaker and the microphone, and the distance between the ears can be varied.

14 Claims, 5 Drawing Sheets

REVERBERANT CHARACTERISTIC SIGNAL GENERATION APPARATUS

BACKGROUND OF THE INVENTION

1. Field of the Invention

This invention relates to a reverberant characteristic signal generation apparatus for generating a reverberant characteristic signal used for a sound generation source with a stereophonic reverberation effect.

2. Description of the Prior Art

A reverberant characteristic signal generation apparatus for generating a reverberant characteristic signal used for a sound generation source with a stereophonic reverberation effect is known. Such a prior art reverberant characteristic signal generation apparatus comprises a room having walls defining a sound field, a sound signal generation unit for emitting an impulse sound at a first location within the sound field, a dummy head having a first microphone as a right ear of the dummy head and second microphone as a left ear of the dummy head, a first pulse extracting units for extracting a first pulse train, having a predetermined number of pulses, derived from the indirect transmission of the impulse sound from the sound signal generation unit through the sound field to the first microphone, and a second pulse extracting units for extracting a second pulse train, having a predetermined number of pulses, derived from the indirect transmission of the impulse sound from the sound signal generation unit through the sound field to the first microphone, and first and second recorders for recording the first and second pulse trains respectively.

FIG. 5 is a block diagram of a prior art reverberant characteristic signal generation apparatus. This prior art reverberant characteristic signal generation apparatus comprises a room having walls defining a sound field 101, a sound signal generation unit 102 and I03 for emitting an impulse sound at a first location within the sound field, a dummy head 104 having a first microphone **104*r* as a right ear of the dummy head and a second microphone 104*l* as a left ear of the dummy head 104, a first pulse extracting unit 107 for extracting a first pulse train, having a predetermined number of pulses, derived from the indirect transmission of the impulse sound from the sound signal generation unit 102 and 103 through the sound field 101 to the first microphone 104*r*, and a second pulse extracting unit 108 for extracting a second pulse train, having the predetermined number of pulses, derived from the indirect transmission of the impulse sound from the sound signal generation unit 102 and 103 through the sound field 101 to the first microphone, and first and second recorders 109 and 110** for recording the first and second pulse trains respectively.

These first and second pulse trains have a correlation less than one, i.e., these are not equal each other. A sound source for generating a sound with a stereophonic reverberation effect generates a sound with stereophonic reverberation effect using the first and second pulse trains through a superimpose or convolution technique.

SUMMARY OF THE INVENTION

The aim of the present invention is to provide an improved reverberant characteristic signal generation apparatus.

According to the present invention there is provided a first reverberant characteristic signal generation apparatus for generating a reverberant characteristic signal used for a sound generation source with a stereophonic reverberation effect, comprising a room having walls defining a sound field; a sound signal generation portion for emitting an impulse sound at a first location within the sound field; a receiving portion for receiving a sound at a second location having an interval from the first location and generating a receiving signal; an extracting portion for extracting, from the receiving signal, a pulse train having a predetermined number of pulses derived from the directly transmitted impulse sound and indirectly transmitted impulse sounds to the receiving portion and for supplying an amplitude value of each of the pulses, a delay time of each of the pulses from when the impulse sound is generated to arrival of each of the pulses to the receiving portion; a direction data generation portion responsive to each of the pulses for generating direction data with respect to each of the pluses derived from the indirect transmitted impulse sounds toward the receiving portion; a first operation portion responsive to each of the pulses for operating, assuming that an imaginary dummy head having right and left ears having a distance therebetween is provided at the second location, a first time difference between a first instance when each of indirectly transmitted impulse sounds reaches the receiving portion and a second instance when each of indirectly transmitted impulse sounds would reach the right ear in the direction represented by the direction data and operating a second time difference between the first instance and a third instance when each of indirectly transmitted impulse sounds would reach the left ear in the direction represented by the direction data in accordance with the distance and an incident direction; a second operation portion for adding the first time difference to the delay time of each pulse as a right channel delay time and adding the second time difference to the delay time of each pulse as a left channel delay time; and an outputting portion for outputting the right and left channel delay times and the amplitude value of each of the pulses as the reverberant characteristic signal.

According to the present invention there is also provided a second reverberant characteristic signal generation apparatus for generating a reverberant characteristic signal used for a sound generation source with a stereophonic reverberation effect, comprising a simulation portion for generating a pulse train, having a predetermined number of pulses, such that an impulse sound is emitted at a first location within a room having walls defining a sound field having a size and direct and indirect transmitted impulse sounds emitted at the first location are received at a second location within the sound field, the second location having an interval from the first location, and the pulses are extracted from received direct and indirect impulse sounds as the pulse train, and for supplying an amplitude value of each of the pulses, a delay time of each of the pulses from when the impulse sound is generated to arrival of each of the pulses to the second location; a direction data generation portion for generating direction data with respect to each of the pluses derived from the indirect transmitted impulse sounds toward the second location; a first operation portion responsive to each of the pulses for operating, assuming that an imaginary dummy head having right and left ears having a distance therebetween is provided at the second location, a first time difference between a first instance when each of indirectly transmitted impulse sounds reaches the second location and a second instance when each of indirectly transmitted impulse sounds would reach the right ear in the direction represented by the direction data and operating a second time difference between the first instance and a third instance when each of indirectly transmitted impulse sounds would reach the left ear in the direction represented by the direction data in accordance with the distance and an incident direction; a second operation portion for adding the first time difference to the delay time of each pulse as a right channel delay time and adding the second time difference to the delay time of each pulse as a left channel delay time; and an outputting portion for outputting the right and left channel delay times and the amplitude value of each of pulses as the reverberant characteristic signal.

In the first and second reverberant characteristic signal generation apparatus, the second operation portion may be omitted and the outputting portion outputs the first and second time differences, the delay time, and the amplitude of each of the pulses of the pulse train.

In the first and second reverberant characteristic signal generation apparatus, the direction generation portion may comprise a random number generation portion for generating a random number within a predetermined range indicative of the direction data.

The first and second reverberant characteristic signal generation apparatus may further comprise a setting portion for setting a predetermine value to the distance.

In the first and second reverberant characteristic signal generation apparatus having the random number generation portion, the predetermined range is 2 radians from the front in either of the clockwise and counterclockwise directions.

In the first and second reverberant characteristic signal generation apparatus having the random number generation portion, the random number generation portion may generate the random number uniformly within the predetermined range or generate the random number with a normal distribution within the predetermined range.

The first and second reverberant characteristic signal generation apparatus may further comprise recorder for recording data of the right and left channel delay times and the amplitude value of each of pulses as the reverberant characteristic signal or recording right and left channel pulse trains, each pulse having delay time controlled in accordance with the imaginary direction.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Hereinbelow will be described a first embodiment of this invention.

Figure 1:
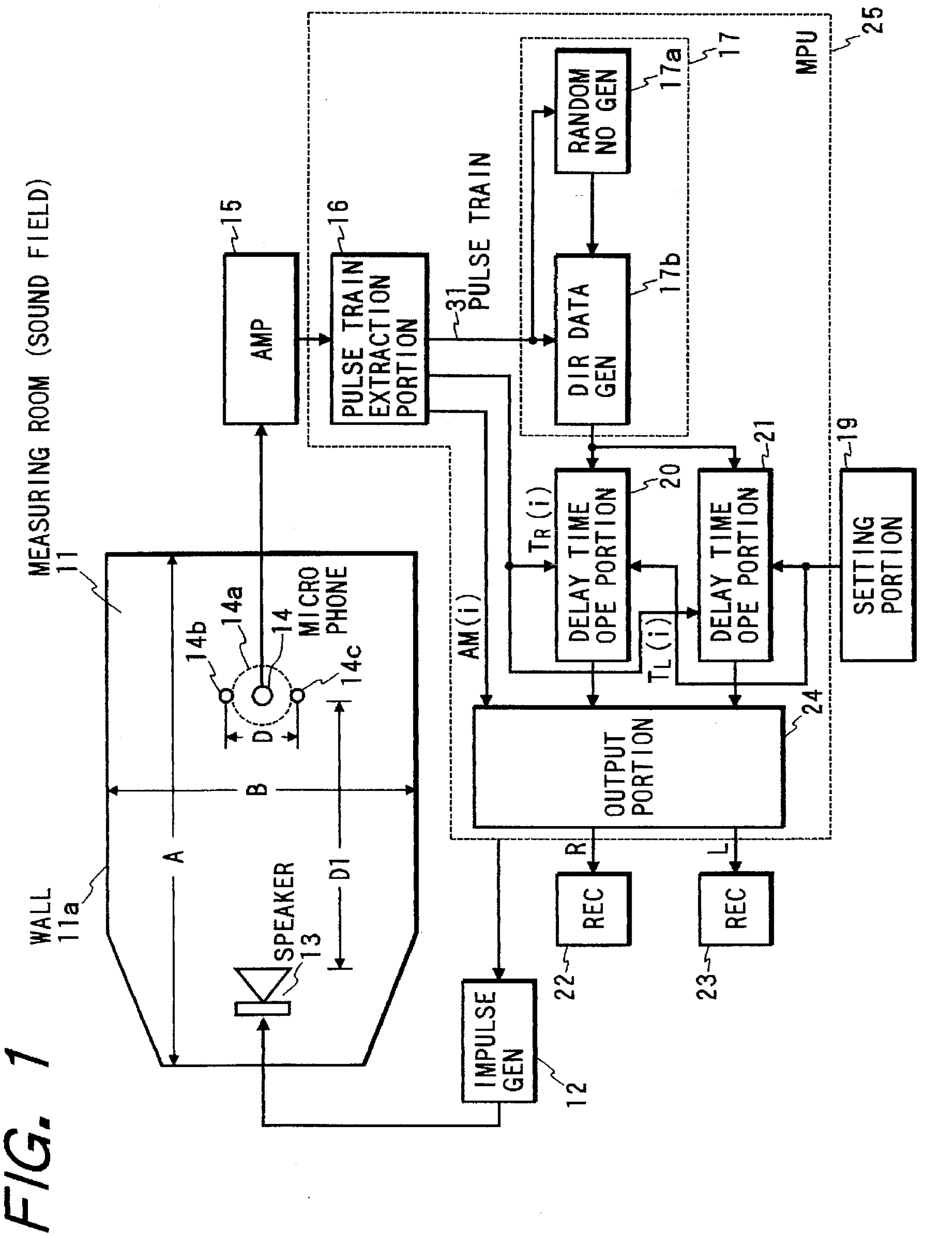
FIG. 1 is a block diagram of this invention of a reverberant characteristic signal generation apparatus.

FIG. 1 is a block diagram of this invention of a reverberant characteristic signal generation apparatus for generating a reverberant characteristic signal used for a sound generation source with a stereophonic reverberation effect. This reverberant characteristic signal generation apparatus comprises an impulse generator 12 responsive to a command signal for generating an impulse signal, a measuring room 11 having walls defining a sound field having a predetermined sizes A and B, a speaker 13 for emitting an impulse sound at a first location within the sound field in response to the impulse signal, a microphone 14, confronting the speaker 13, for receiving a sound at a second location having a distance D1 from the first location and generating a receiving signal and generating a sound signal, an amplifier 15 for amplifying the sound signal, a pulse train extraction portion 16 for extracting a pulse train, having N pulses (N is a natural number), derived from the direct and indirect transmission of the impulse sounds from the speaker 13 through the sound field 11 from the speaker 13, a direction data assigning portion 17 including a random number generation portion 17*a* responsive to each of the pulses for generating a random number within a first predetermined range and a direction data generation portion 17*b* responsive to each of the pulses for generating direction data within a second predetermined range with respect to each of the pluses derived from the indirect transmission of the impulse sound at the second location in accordance with the random number from the random number generation portion 17*a*; a delay time operation portion 20 responsive to each of the pulses for operating, assuming that an imaginary dummy head 14*a* having right ear 14*b* and left ear 14*c* having a distance therebetween is provided at the location of the microphone 14, a first time difference between a first instance when each of indirectly transmitted impulse sounds reaches the microphone 14 and a second instance when each of indirectly transmitted impulse sounds would reach the right ear 14*b* in the direction represented by the direction data and for adding the first time difference to the delay time of each pulse as a right channel delay time; and a delay time operation portion 21 for operating a second time difference between the first instance and a third instance when each of indirectly transmitted impulse sounds would reach the left ear 14*c* in the direction represented by the direction data in accordance with the distance D and an incident direction and for adding the first time difference to the delay time of each pulse as a right channel delay time and adding the second time difference to the delay time of each pulse as a left channel delay time; and an outputting portion 24 for outputting the right and left channel delay times and the amplitude value of each of the pulses as the reverberant characteristic signal and first and second recorders 22 and 23 for recording the each of pulses and the first difference time operated to each of pluses as a right channel of the reverberant characteristic signal and recording each of pulses and the second difference time operated to each of pluses as a left channel of the reverberant characteristic signal respectively. More specifically, the output portion 24 outputs the right and left channel delay times and the amplitude value of each of the pulses as right and left channels of the reverberant characteristic signal. The recorder 22 records N sets of timing data and an absolute amplitude value and data of the first time difference data. Similarly, the recorder 23 records N sets of data of the right and left channel delay times and the amplitude values.

The impulse generator 12 generates an impulse signal. The speaker 13 emits an impulse sound at a first location within the sound field 11 in response to the impulse signal. The impulse sound transmits through the air in the room 11 and reaches the microphone 14 directly with a delay and is reflected by walls 11*a* at least once and reflected impulse sounds reach the microphone with further delay interval. The microphone 14 is so arranged as to confront the speaker 13 at the second location the distance D1 apart from the speaker 13. The microphone 14 receives a sound and generates a sound signal including the directly transmitted impulse sound and reflected (indirectly transmitted) impulse sounds. The amplifier 15 amplifies the sound signal. The pulse train extraction portion 16 extracts the pulse train, having N pulses (N is a natural number), derived from the direct and indirect transmission of the impulse sound from the speaker 13 through the sound field 11 from the sound signal. More specifically, the pulse train extraction circuit 16 repeats a detection of a maximum value from the received sound signal and then, effecting a masking processing with the detection of the maximum value until N pulses have been provided as the pulse train. However, there are many pulse extraction processings. For example, N peaks of the received sound signal are converted into the pulse train and absolute values of the received sound signal are converted into the pulse train. This pulse train including N pulses (N is the natural number) are given by:

An amplitude of $i^{th}$ pulse: $A(i)$ $(i=1\sim N)$

A delay time of $^{th}$ pulse: $T(i)$ $(i=1\sim N)$

Each of output pulses of the pulse train extraction portion 16 is supplied to the direction data assigning portion 17, and the amplitude A(i) is supplied to the output portion 24, and the delay time T(i) is supplied to the delay time operation portion 20 and 21. The direction data assigning portion 17 assigns imaginary direction data to each pulse, assuming that each pulse is incoming to an imaginary dummy head 14 having right and left ears 14*b* and 14*c* having a distance D in the imaginary direction. In response to each pulse, the random data generation portion 17*a* generates a random number and the direction data generation portion 17*b* generates direction data within 2 radians for example in accordance with the random number wherein 0° is the front of the dummy head 14*a*, i.e. the direction to the speaker 13. That is, the direction assigning portion 17 determines an imaginary direction to each pulse of the pulse train toward the imaginary dummy head 14*a* to provide a stereophonic reverberation effect. Then, when a listener listens the sound from a sound source with stereophonic reverberation in accordance with the reverberant characteristic signal provided by this reverberant characteristic signal generation apparatus, he feels a reverberant sound with a stereophonic reverberation effect having the incident angel range of two radians as provide as mentioned. In fact, the incoming direction is not true and cannot be detected because there is only one microphone 14 for receiving the sound. However, this imaginary assigning of the direction to each reverberant sound (pulse) sufficiently provides the stereophonic reverberation effect to the listener. That is, the incident direction φ to the right and left ears 14*b* and 14*c* is assumed as from 0° as the front of the dummy head 14*a* to 2 radians. Therefore, the incident direction is given by:

$\phi(i)(i=1\sim N)$

It is favorable that the random number generation portion 17*a* and the direction data generation portion 17*b* generate the direction data uniformly over the range from 0° to two radians. However, it is also possible that the random number generation portion 17*a* and the direction data generation portion 17*b* generate the direction data with a normal distribution wherein the frequency of occurrence of the direction data is maximum at the front of the dummy head 14*a*. This provides a different stereophonic reverberation feeling to the listener.

The setting portion 19 sets the distance D between the right and left ears 14*b* and 14*c* to a desired value. The delay time operation portion 20 responsive to each of the pulses operates, assuming that an imaginary dummy head 14*a* having right ear 14*b* and left ear 14*c* having the distance D therebetween is provided at the location of the microphone 14, a first time difference between a first instance when each of indirectly transmitted impulse sounds reaches the microphone 14 and a second instance when each of indirectly transmitted impulse sounds would reach the right ear 14*b* in the direction represented by the direction data and adds the first time difference to the delay time of each pulse as a right channel delay time. The delay time operation portion 21 operates a second time difference between the first instance and a third instance when each of indirectly transmitted impulse sounds would reach the left ear 14*c* in the direction represented by the direction data in accordance with the distance D and an incident direction and adds the first time difference to the delay time of each pulse as a right channel delay time and adding the second time difference to the delay time of each pulse as a left channel delay time. The outputting portion 24 outputs the right and left channel delay times and the amplitude value of each of the pulses as the reverberant characteristic signal. The recorder 22 records N sets of timing data and an absolute amplitude value and data of the first time difference data. Similarly, the recorder 23 records N sets of data of the right and left channel delay times and the amplitude values.

More specifically, the delay time operation portion 20 operates the first time difference $\Delta T_R(i)(i=1\sim N)$ for the right ear 14*b* in accordance with the incident direction φ (i) and the distance D as follows:

$$\text{when } 0\leqq\phi(i)<0.5,\ \Delta T_R(i)=-(D\times\pi\times\phi(i))/(C\times 2)$$

$$\text{when } 0.5\leqq\phi(i)<1.0,\ \Delta T_R(i)=-(D\times\pi\times(1.0-\phi(i)))/(C\times 2)$$

$$\text{when } 1.0\leqq\phi(i)<1.5,\ \Delta T_R(i)=(D\times\pi\times\sin(\phi(i)-1.0))/(C\times 2)$$

$$\text{when } 1.5\leqq\phi(i)<2.0,\ \Delta T_R(i)=(D\times\pi\times\sin(2.0-\phi(i)))/(C\times 2) \quad (1)$$

where C is the sound velocity.

Similarly, the delay time operation portion 21 operates the second time difference ΔTl(i)(i=1~N) for the left ear 14*c* in accordance with the incident direction φ and the distance D as follows:

$$\text{when } 0\leqq\phi(i)<0.5,\ \Delta T_L(i)=(D\times\pi\times\sin(\phi(i))/(C\times 2)$$

$$\text{when } 0.5\leqq\phi(i)<1.0,\ \Delta T_L(i)=(D\times\pi\times\sin\ (1.0-\phi(i))/(C\times 2)$$

$$\text{when } 1.0\leqq\phi(i)<1.5,\ \Delta T_L(i)=-(D\times\pi\times(\phi(i)-1.0))/(C\times 2)$$

$$\text{when } 1.5\leqq\phi(i)<2.0,\ \Delta T_L(i)=-(D\times\pi\times(2.0-\phi(i)))/(C\times 2) \quad (2)$$

The delay time operation portion 20 and 21 operates the final delay times for right and left ears respectively as follows:

$$FT_R(i)=\Delta T_R(i)+T_R(i)$$

$$FT_L(i)=\Delta T_L(i)+T_L(i) \quad (3)$$

That is, the delay time operation portion 20 outputs the final delay time obtained by summing a delay time from generation of the impulse sound to the microphone 14 to the arrival of the impulse sound and the delay time $\Delta T_R(i)$ due to an inclined incident direction φ (i) to the right ear 14*b*.

Similarly, the delay time operation portion 21 outputs the final delay time obtained by summing a delay time from generation of the impulse sound to the microphone 14 to the arrival of the impulse sound and the delay time $\Delta T_L(i)$ due to the inclined incident direction $\phi$ (i) to the left ear 14*c*.

The output portion 24 supplies the final delay times $FT_R(i)$ together with the absolute amplitude value of each of pulses from the pulse train extraction portion 16 to the recorder 22 as the right channel of the stereophonic reverberant characteristic signal and supplies the final delay times $FT_L(i)$ together with the absolute amplitude value to the recorder 23 as the left channel of the stereophonic reverberant characteristic signal.

The correlation between both ears varies from 1 to 0 with the change in the distance D between the right and the left ears from 0 to one meter. However, it is natural that the distance representing the distance between both human ears is less than 0.23 m.

The data recorded by the recorders 22 and 23 will be supplied to a sound source for generating a sound with a stereophonic reverberation effect. It generates a sound with stereophonic reverberation effect using the absolute amplitude value and final delay time data of the right and left ears of each of the pulses through the superimpose or convolution technique.

The operations by the pulse train extraction portion 16, the random number generation portion 17*a*, the direction data generation portion 17*b*, the delay time operation portions 20 and 21, and the output portion 24 are executed by a microprocessor (MPU) 25 in accordance with a program stored in a ROM included in the microprocessor 25.

Figure 2:
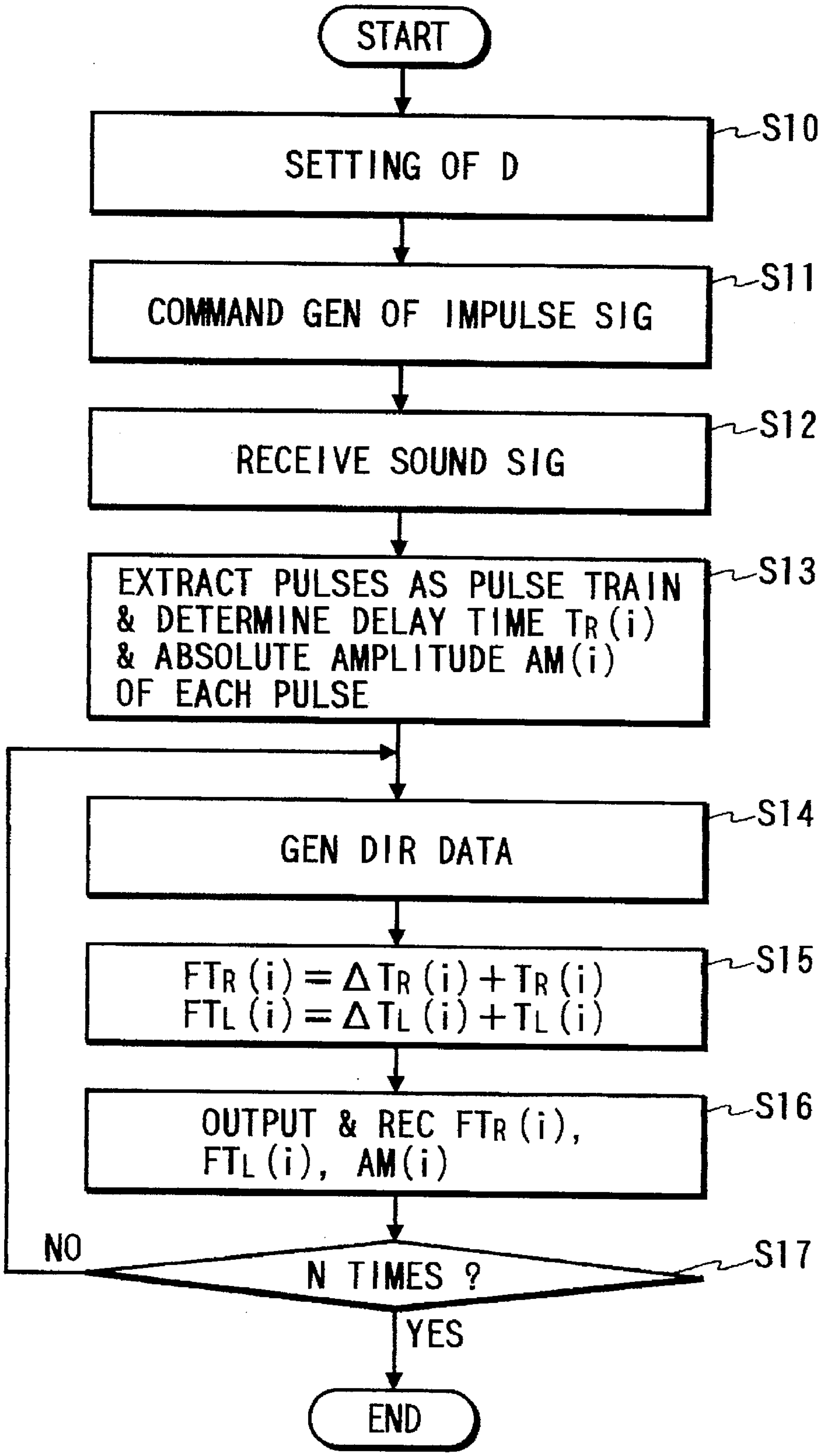
FIG. 2 is a diagram of the first embodiment showing a flow chart representing the program of the reverberant characteristic signal generation operation.

FIG. 2 is a diagram of the first embodiment showing a flow chart representing the program of the reverberant characteristic signal generation operation.

In step s1O, the microprocessor 25 sets the distance D to a standard value and if there is a request for changing the value of the distance D to a desired value, the microprocessor 25 requests and receives a new desired value of the distance D. In the following step s11, the microprocessor 25 commands the impulse generation portion 12 to generate the impulse signal using the command signal. Then, the impulse sound is emitted from the speaker and received by the microphone 14. The microprocessor 25 receives the sound signal including the directly transmitted pulse sound and indirectly transmitted impulse sound from the microphone 14 via the amplifier 15 in step s12. In the following step s13, the microprocessor extracts pulses as a pulse train from the sound signal and determines the delay time $T_R(i)$ and $T_L(i)$ of each pulse in the pulse train and the absolute amplitude value of each pulse.

In the following step s14, the microprocessor 25 generates the direction data using a random number for each pulse. In step s15, the microprocessor 25 determines the final delay times including the difference times due to the incoming direction to the right and left eras 14*b* and 14*c*. In step s16, the microprocessor outputs and records the final delay times $FT_R(i)$ and $FT_L(i)$ and the absolute amplitude AM(i) of each pulse. The processing from step s14 to s16 are repeated N times for all pulses in the pulse train.

Figure 3:
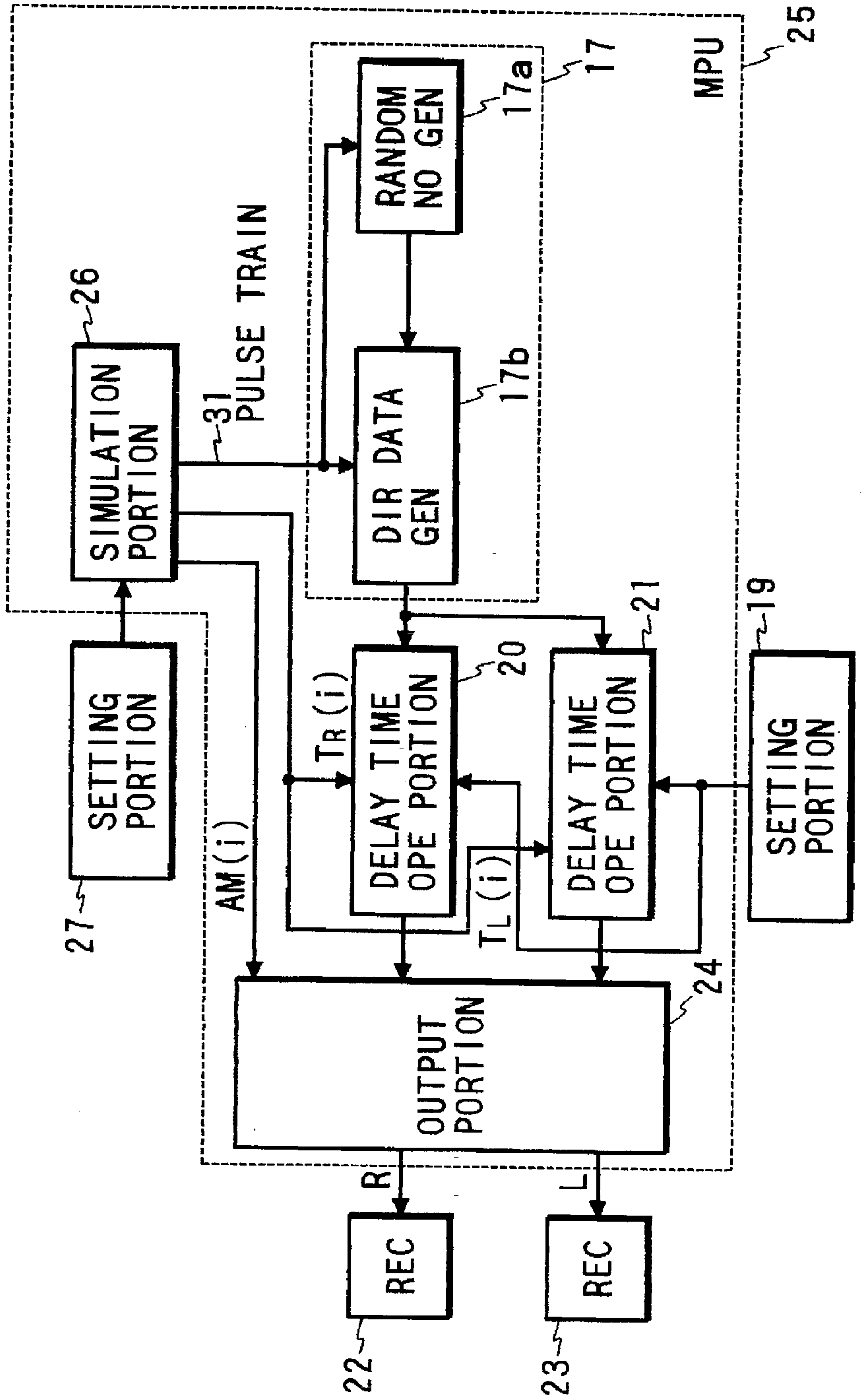
FIG. 3 is a block diagram of a reverberant characteristic signal generation apparatus of a second embodiment.

A second embodiment will be described. FIG. 3 is a block diagram of a reverberant characteristic signal generation apparatus of a second embodiment. A simulation portion 26 and the setting portion 25 replace the impulse generation portion 12, the speaker 13, the microphone 14, the amplifier 15, and the pulse train extraction portion 16 of the first embodiment. Other structure is the same as the first embodiment. The simulation portion 26 generates the pulse train through a simulation processing. This simulation processing simulates the impulse sound transmission processing in the room 11*a* shown in FIG. 1 through the sound ray tracing method or the image method. The simulation portion 26 simulates the impulse sound transmission processing in accordance with the parameters inputted from the setting portion 27. For example, the sizes A and B of the measuring room 11 and the distance D1 or the like are inputted. The simulation portion 26 executes the simulation processing and determines a pulse train as the result of the simulation. The following operation is the same as the first embodiment.

Figure 4:
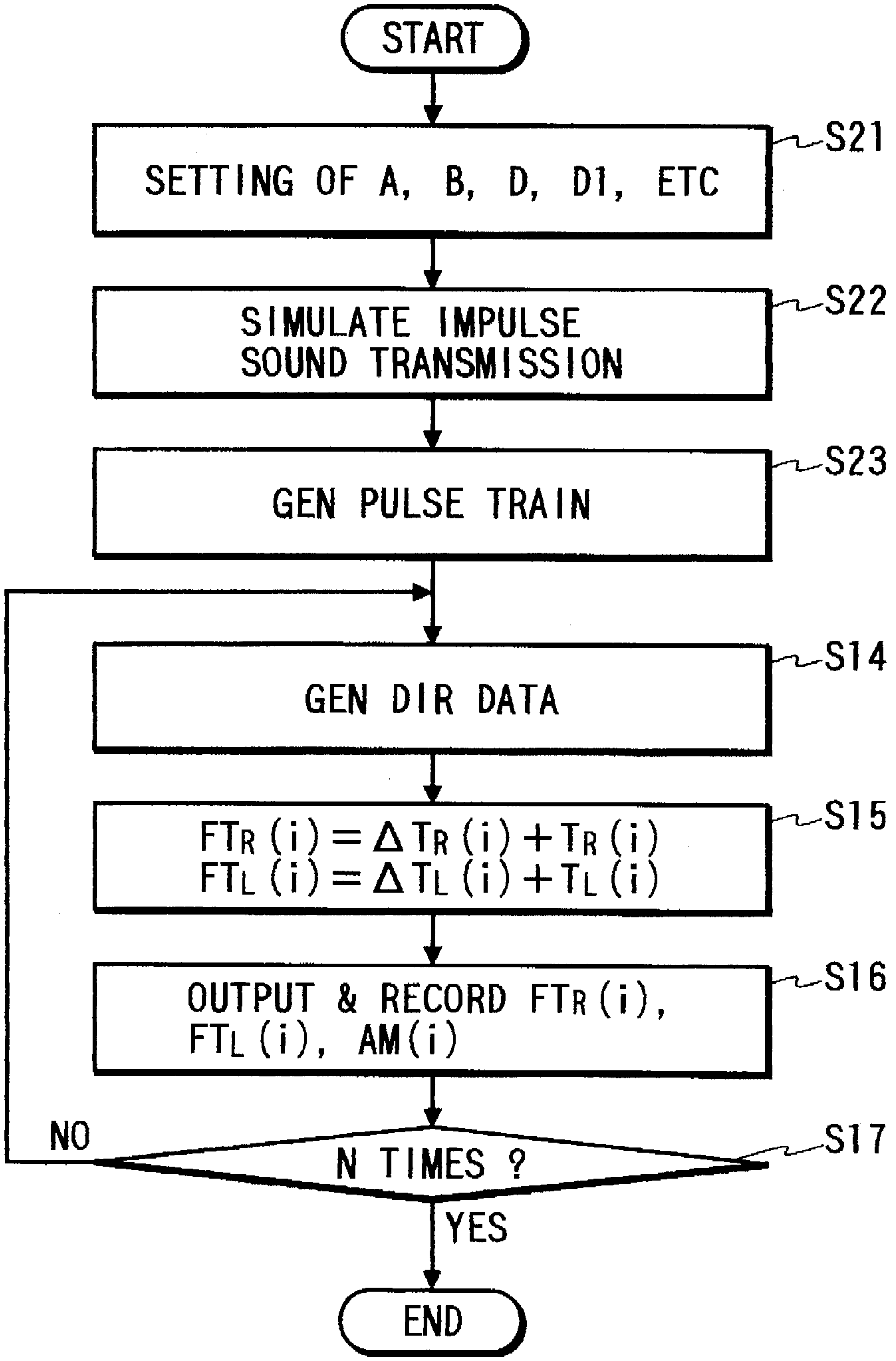
FIG. 4 is a diagram of a flow chart of the reverberant characteristic signal generation operation of the second embodiment.
Figure 5:
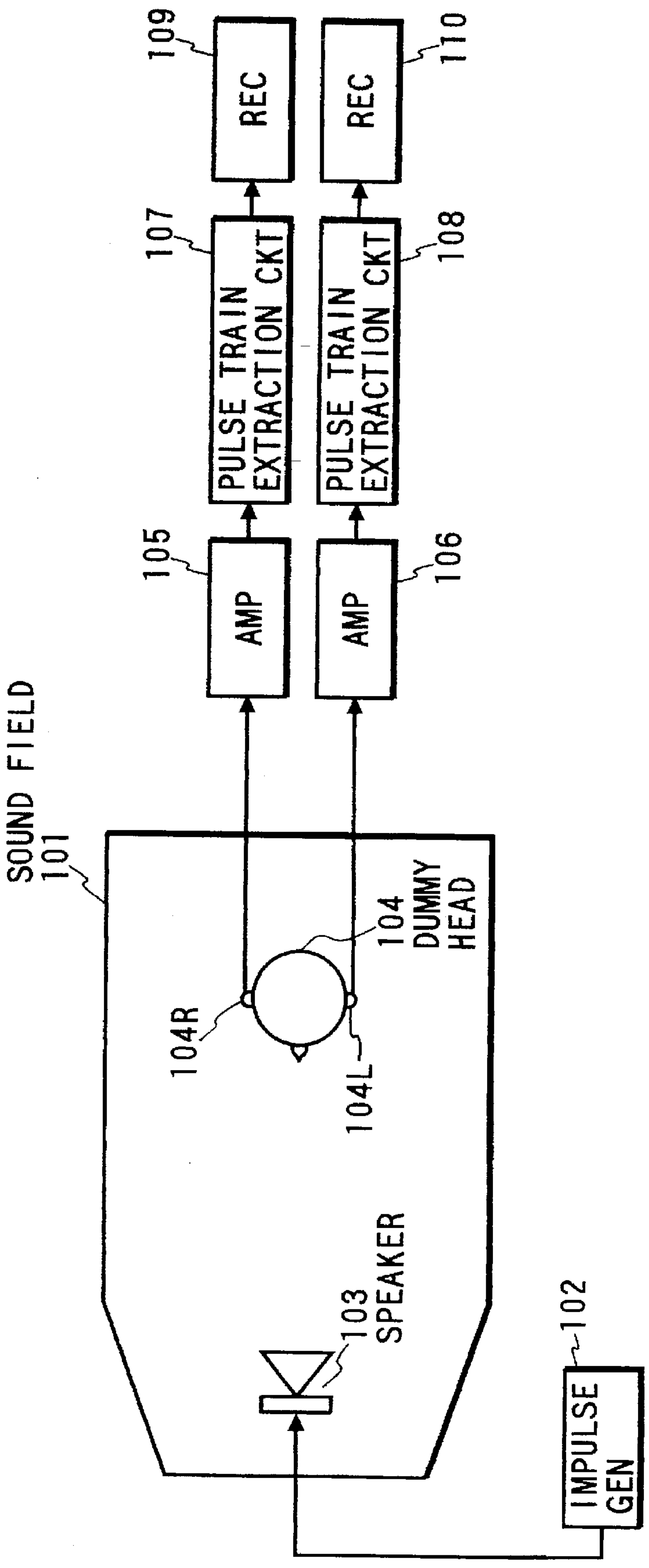
FIG. 5 PRIOR ART
FIG. 5 is a block diagram of a prior art reverberant characteristic signal generation apparatus.

FIG. 4 is a diagram of a flow chart of the reverberant characteristic signal generation operation of the second embodiment. In step s21, the microprocessor 25 sets the sizes A, B of the room 11, the distance D1 between the speaker 13 and the microphone 14, or the like to standard values and further sets the distance D1. If there is any change of the parameters, the microprocessor 25 receives the change and sets the value again. In the following step s22, the microprocessor 25 executes the simulation operation. In step s23, the microprocessor 25 generates a pulse train as the result of the simulation and supplies the delay time $T_R(i)$ and $T_L(i)$ of each pulse in the pulse train and the absolute amplitude value of each pulse. The following processing from the step s14 to step s17 is the same as the first embodiment.

As mentioned above, the reverberant characteristic signal generation apparatus generates the imaginary incoming direction of the impulse sound reflected by walls toward an imaginary dummy head 14*a* in a room 11 in accordance with the random number generated for each impulse sound and operates the delay times due to the inclined incoming direction toward the right and left ears 14*b* and 14*c* and this delay times are added to the delay time of the impulse sound arrived the imaginary dummy head (microphone 14) and the results are outputted and recorded. Therefore, there are two channels of a pulse train having a correlation less than one as the right and left channels of the reverberant characteristic signal. The distance D1 representing the size of the imaginary dummy head can be changed freely, so that a favorable stereophonic reverberant effect can be provided when this reverberant characteristic signal is provided to a sound generation source with a stereophonic reverberation effect.

The reverberant characteristic signal generation apparatus mentioned above has the recording portions 22 and 23. However, these portions can be omitted if the sound generation source with a stereophonic reverberation effect can directly receive this reverberant characteristic signal. Moreover, in the above mentioned embodiments, the delay time time $\Delta T_R(i)$ and $\Delta T_L(i)$ are added to the delay time of each pulse from the speaker to the microphone 14. However, it is also possible to output the delay times of each pulse from the speaker to the microphone 14 and the delay time $\Delta T_R(i)$ and $A\,T_L(i)$ are outputted with the absolute amplitude value of each pulse in parallel without the addition. The outputting circuit outputs data of the right and left channel delay times and the amplitude value of each of pulses as the reverberant characteristic signal in a digital form or outputting pulses of right and left channels having the absolute amplitudes and delay outputting right and left channel pulses trains, each pulse having delay time controlled.

What is claimed is:

1. A reverberant characteristic signal generation apparatus for generating a reverberant characteristic signal used for a sound generation source with a stereophonic reverberation effect, comprising a room having walls defining a sound field;

sound signal generation means for emitting an impulse sound at a first location within said sound field;

receiving means for receiving said impulse sound at a second location having an interval from said first location and generating a receiving signal;

extracting means for extracting, from said receiving signal, a pulse train having a predetermined number of pulses derived from the directly transmitted impulse sound and indirectly transmitted impulse sounds to said receiving means and for supplying an amplitude value of each of said pulses and a delay time of each of said pulses from when the impulse sound is generated at arrival of each of said pulses to said receiving means;

direction data generation means responsive to each of said pulses for generating direction data with respect to each of said pulses derived from said indirectly transmitted impulse sounds toward said receiving means;

first operation means responsive to each of said pulses for operating, assuming that an imaginary dummy head having right and left ears having a distance therebetween is provided at said second location, a first time difference between a first instance when each of said indirectly transmitted impulse sounds reaches said receiving means and a second instance when each of said indirectly transmitted impulse sounds reaches said right ear in the direction represented by said direction data and operating a second time difference between said first instance and a third instance wherein said third instance is when each of said indirectly transmitted impulse sounds reaches said left ear in the direction represented by said direction data in accordance with said distance and an incident direction;

second operation means for adding said first time difference to said delay time of each pulse as a right channel delay time and adding said second time difference to said delay time of each pulse as a left channel delay time; and outputting means for outputting said right and left channel delay times and said amplitude value of each of said pulses as said reverberant characteristic signal.

2. A reverberant characteristic signal generation apparatus as claimed in claim 1, wherein said direction data generation means comprises a random number generation means for generating a random number within a predetermined range indicative of said direction data.

3. A reverberant characteristic signal generation apparatus as claimed in claim 1, further comprises a setting means for setting a predetermine value to said distance.

4. A reverberant characteristic signal generation apparatus as claimed in claim 2, wherein said predetermined range is 2 radians from the front in the clockwise and counterclockwise directions.

5. A reverberant characteristic signal generation apparatus as claimed in claim 2, wherein said random number generation means generate said random number uniformly within said predetermined range.

6. A reverberant characteristic signal generation apparatus as claimed in claim 2, wherein said random number generation means generate said random number with a normal distribution within said predetermined range.

7. A reverberant characteristic signal generation apparatus as claimed in claim 1, further comprising a recorder for recording said right and left channel delay times and said amplitude value of each of said pulses as said reverberant characteristic signal.

8. A reverberant characteristic signal generation apparatus for generating a reverberant characteristic signal used for a sound generation source with a stereophonic reverberation effect, comprising a room having walls defining a sound field;

sound signal generation means for emitting an impulse sound at a first location within said sound field;

receiving means for receiving said impulse sound at a second location having an interval from said first location and generating a receiving signal;

extracting means for extracting, from said receiving signal, a pulse train having a predetermined number of pulses derived from the directly transmitted impulse sound and indirectly transmitted impulse sounds to said receiving means and for supplying an amplitude value of each of said pulses and a delay time of each of said pulses from when the impulse sound is generated at arrival of each of said pulses to said receiving means;

direction data generation means responsive to each of said pulses for generating direction data with respect to each of said pulses derived from said indirectly transmitted impulse sounds toward said receiving means;

operation means responsive to each of said pulses for operating, assuming that an imaginary dummy head having right and left ears having a distance therebetween is provided at said second location, a first time difference between a first instance when each of said indirectly transmitted impulse sounds reaches said receiving means and a second instance when each of said indirectly transmitted impulse sounds reaches said right ear in the direction represented by said direction data and operating a second time difference between said first instance and a third instance wherein said third instance is when each of said indirectly transmitted impulse sounds reaches said left ear in the direction represented by said direction data in accordance with said distance and an incident direction; and outputting means for outputting summed of said first time difference to said delay time of each pulse, summed of said second time difference to said delay time of each pulse, said delay time, and said amplitude value of each of pulses as said reverberant characteristic signal.

9. A reverberant characteristic signal generation apparatus for generating a reverberant characteristic signal used for a sound generation source with a stereophonic reverberation effect, comprising simulation means for generating a pulse train, having a predetermined number of pulses, such that an impulse sound emitted at a first location within a room having walls defining a sound field having a size and directly and indirectly transmitted impulse sounds emitted at said first location are received at a second location within said sound field, said second location having an interval from said first location, and said pulses are extracted from received said directly and indirectly impulse sounds as said pulse train and for supplying an amplitude value of each of said pulses and a delay time of each of said pulses from when the impulse sound is generated at arrival of each of said pulses to said second location;

direction data generation means for generating direction data with respect to each of said pulses derived from said indirectly transmitted impulse sounds toward said second location;

first operation means responsive to each of said pulses for operating, assuming that an imaginary dummy head having right and left ears having a distance therebetween is provided at said second location, a first time difference between a first instance when each of said indirectly transmitted impulse sounds reaches said second location and a second instance when each of said indirectly transmitted impulse sounds reaches said right ear in the direction represented by said direction data and operating a second time difference between said first instance and a third instance wherein said third instance is when each of said indirectly transmitted impulse sounds reaches said left ear in the direction represented by said direction data in accordance with said distance and an incident direction;

second operation means for adding said first time difference to said delay time of each pulse as a right channel delay time and adding said second time difference to said delay time of each pulse as a left channel delay time; and outputting means for outputting said right and left channel delay times and said amplitude value of each of pulses as said reverberant characteristic signal.

10. A reverberant characteristic signal generation apparatus as claimed in claim 9, further comprising a setting means for setting at least one of said size, said first location, said second location, and said distance.

11. A reverberant characteristic signal generation apparatus as claimed in claim 9, wherein said direction data generation means comprising a random number generation means for generating a random number within a predetermined range indicative of said direction data.

12. A reverberant characteristic signal generation apparatus as claimed in claim 11, wherein said predetermined range is 2 radians from the front in either direction of the right or left direction.

13. A reverberant characteristic signal generation apparatus as claimed in claim 11, wherein said random number generation means generate said random number uniformly within said predetermined range.

14. A reverberant characteristic signal generation apparatus as claimed in claim 11, wherein said random number generation means generate said random number with a normal distribution within said predetermined range.

* * * * *